United States Patent [19]

Nordholt et al.

[11] Patent Number: 4,742,566
[45] Date of Patent: May 3, 1988

[54] AM RECEIVER

[75] Inventors: Ernst H. Nordholt, Berkel en Rodenrijs; Hendrikus C. Nauta, Nootdorp, both of Netherlands

[73] Assignee: U.S. Philips Corporation, New York, N.Y.

[21] Appl. No.: 838,224

[22] Filed: Mar. 10, 1986

[30] Foreign Application Priority Data

Mar. 11, 1985 [NL] Netherlands ............... 8500675

[51] Int. Cl.[4] ................ H04B 1/26; H03L 7/00
[52] U.S. Cl. ........................ 455/260; 455/264; 455/315; 331/15; 331/22
[58] Field of Search ............ 455/260–266, 455/214, 337, 315–318, 108; 331/11, 15, 18, 22, 31; 375/120

[56] References Cited

U.S. PATENT DOCUMENTS

| | | | |
|---|---|---|---|
| 4,484,154 | 11/1984 | Pavin | 331/18 |
| 4,556,988 | 12/1985 | Yoshisato | 455/260 |
| 4,607,393 | 10/1986 | Nolde et al. | 455/260 |
| 4,631,499 | 12/1986 | Kasperkovitz | 331/11 |

Primary Examiner—Robert L. Griffin
Assistant Examiner—Curtis Kuntz
Attorney, Agent, or Firm—Thomas A. Briody; Algy Tamoshunas; Marianne R. Rich

[57] ABSTRACT

AM receiver comprising a tuning oscillator (T0), a first phase detector (PD1) and a first loop filter (LP1) successively arranged in a first phase control loop. The tuning oscillator (T0) is synchronized with a reference oscillator (VCX0) coupled to the first phase detector (PD1) and applies a mixing frequency to a mixer stage (M) for conversion of a received AM signal into an IF-AM signal. The mixer stage (M) is coupled to an AM demodulator (SD) for demodulation of the base-band modulation signal. The reference oscillator (VCX0) is controllable and is disposed between a second loop filter (LP2) and a second phase detector (PD2) of a second phase control loop coupled to the mixer stage (M) for applying a local detection carrier synchronized with the IF-AM signal carrier to the AM demodulator (SD). The second loop filter (LP2) applies a control signal to the reference oscillator (VCX0) and is connected through a coupling circuit (C) to a control input of the tuning oscillator (T0) for a negative feedback of the control signal of the reference oscillator (VCX0) to the tuning oscillator (T0).

6 Claims, 3 Drawing Sheets ample, from United States Patent Specification No.
AM RECEIVER

The invention relates to an AM receiver comprising a tuning oscillator, a first phase detector and a first loop filter successively arranged in a first phase control loop. The tuning oscillator is synchronized with a reference oscillator coupled to the first phase detector, and applies a mixing frequency signal to a mixer stage for conversion of a received AM signal into an IF-AM signal. The mixer stage is coupled to an AM demodulator for demodulation of the base-band modulation signal.

An AM receiver of this type is known from the article "Frequenzsynthesizer in Grundig Rundfunkgeräten der Spitzenklasse" by R. Lehmann, published in "Grundig Technische Information", no. ½, 1980, pages 8–15.

In the known AM receiver the first phase control loop is used for frequency synthesis tuning. In this first phase control loop the mixing frequency is divided in a programmable divider by a dividing factor which is adjustable to discrete values. The divided signal is subsequently compared in the first phase detector with a reference frequency originating from the reference oscillator. The phase difference between the signals applied to the first phase detector is applied to the tuning oscillator after selection in the first loop filter so that the mixing frequency corresponds to a given multiple of the reference frequency determined by said dividing factor. Tuning is stabilized by making use of a crystal oscillator as a reference oscillator and timing frequency is varied by varying the dividing factor of the divider.

When a synchronous AM demodulator is used for demodulation of the IF-AM signal—as is known, for example, from United States Patent Specification No. 3,603,890—a second phase control loop is generally used for generating a local detection carrier synchronized with the IF carrier. An AM receiver using both frequency synthesis tuning and synchronous AM detection therefore includes two phase control loops requiring, as is hitherto known, two voltage-controlled oscillators and one reference oscillator.

To realize an acceptable dynamic range in an AM receiver of this type, comparatively expensive means are required. For example, to limit the pull-in effect of powerful neighbouring transmitters in the case of weak signal reception, the IF filter preceding the second phase control loop should be highly selective, the bandwidth of and the gain in this loop should be fairly narrow and large, respectively, and the voltage-controlled oscillator should be fairly stable. However, these steps may cause unwanted side effects on the tuning behaviour such as, for example, critical tuning. Moreover, the loop gain, the bandwidth and the stability of the second phase control loop are dependent on the amplitude of the IF signal and hence on the amplitude of the received signal. A limiter circuit preceding the second phase detector may reduce this dependence. However, such a limiter circuit should not be used, because in the case of the reception of weak transmitters in the neighbourhood of powerful transmitters it limits the more powerful neighbouring transmitter signal at the expense of the weaker desired signal and hence drastically reduces the dynamic range.

SUMMARY OF THE INVENTION

It is an object of the invention to provide an AM receiver using frequency synthesis tuning and synchronous AM detection, which receiver has an acceptable dynamic range and can be realized with low-cost components and with fewer oscillators.

According to the invention an AM receiver is characterized in that the reference oscillator is controllable and is disposed between a second loop filter and a second phase detector of a second phase control loop coupled to the mixer stage for applying a local detection carrier synchronized with the IF-AM signal carrier to the AM demodulator. The second loop filter applies a control signal to the reference oscillator and is connected through a coupling circuit to a control input of the tuning oscillator for negative feedback of the control signal of the reference oscillator to the tuning oscillator.

In prior German Patent Application No. 33 35 024 the Applicant has described the possiblity of providing a controllable reference oscillator in an FM receiver using frequency synthesis tuning and to use it as a voltage-controlled oscillator in a phase control loop synchronized by a pilot signal in the base-band modulation signal. Since such a pilot signal in the transmitter is derived from a stable crystal frequency, the reference frequency synchronized in the receiver with this pilot signal is also stable and is not directly dependent on phase and/or frequency disturbances of the IF signal. These disturbances of the IF signal frequency are caused, for example, by disturbances in the mixing frequency or by reception of powerful neighbouring transmitters.

When the second phase control loop is synchronized with the IF carrier, however, the following results. A closed loop in which disturbances may be positively fed back and thus give rise to instability is produced through the coupling between the mixer stage and the second phase detector, and the coupling between the reference oscillator and the first phase detector. Such instability particularly occurs when weak signals are received, giving rise to an intermediate frequency signal disturbed in phase and/or frequency by noise, intermodulation and/or neighbouring reception and greatly reduces the dynamic range.

The invention is based on the recognition that the coupling between the two phase control loops through the reference oscillator and the first phase detector provides an extra control possibility for the tuning oscillator from the first loop filter, which control only acts on the phase of the mixing frequency. A dynamic negative interference feedback which stabilizes the aforementioned closed loop and hence considerably increases the dynamic range of the AM receiver can be realized through this extra phase control.

According to the invention, this extra phase control is obtained by a negative feedback of the control signal for the reference oscillator through the coupling circuit to the tuning oscillator. As a result disturbances which are positively fed back to the tuning oscillator from the reference oscillator through the first phase detector and the first loop filter are compensated by the disturbances in the control signal for the reference oscillator. Consequently, the reference oscillator can be used as a reference frequency source for the first phase control loop, for example, for frequency synthesis tuning, and also as a frequency generator for generating a local detection carrier for the purpose of synchronous AM detection in the AM demodulator without reducing the stability and hence the dynamic range of the receiver.

With appropriate choice of the amplification factor of the coupling circuit, the dynamic negative interference feedback obtained through the coupling circuit has the additional advantage of limiting the effects of comparatively large phase disturbances of the IF signal which, in conventional AM receivers, give rise to instabilities in a second phase control loop. For example, the second phase control loop merely serves as a generator circuit for a local detection carrier. These large phase disturbances do not substantially disturb the stability so that a comparatively weakly selective and hence low-cost IF filter may suffice.

The dynamic range is further increased by preventing poles from occurring in the right half-plane in the root locus diagram of the transfer function from the input of the mixer stage to the output of the reference oscillator. To this end a preferred embodiment of the AM receiver according to the invention is characterized by a coupling circuit which includes a frequency-dependent compensation circuit whose transfer function has a pole at the lowest frequency at which a pole occurs in the transfer function of the first loop filter.

This step additionally has the advantage that by suitable choice of the other parameters of the compensation circuit the bandwidth of the total loop circuit is adjustable to a desired value of several Hz (for example, 3 Hz) so that powerful neighbouring transmitters do not substantially disturb the phase coupling with the desired received carrier and hence the tuning.

An AM receiver of this type can be realized in a simple manner in a further preferred embodiment which is characterized in that the frequency-dependent compensation circuit includes a differentiating-integrating network.

In a still further preferred embodiment the coupling circuit includes an inverter circuit for inverting the signal applied to the tuning oscillator.

A simple combination of the functions of the inverter and compensation circuits is preferably obtained by means of an operational amplifier whose inverting input is coupled to the second loop filter, a non-inverting input is connected to ground, and an output is coupled at one end to the inverting input through a resistor-bridged series RC member. Another end of the output is connected to the control input of the tuning oscillator.

The invention will be described in greater detail with reference to the figures shown by way of example in the drawings.

DESCRIPTION OF THE PREFERRED EMBODIMENT

Figure 1:
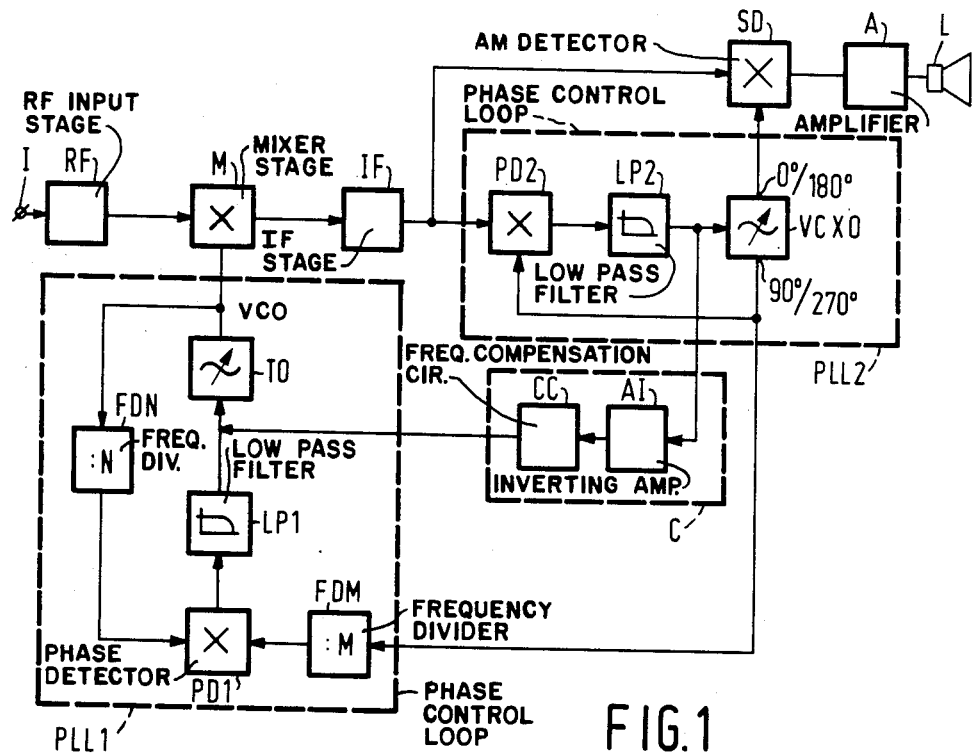
FIG. 1 shows an AM receiver using frequency synthesis tuning and a synchronous AM detector in which an embodiment of the invention is used.

FIG. 1 shows an AM receiver provided with an aerial input I having successively coupled to it an RF-input stage RF, a mixer stage M, an IF-stage IF, a synchronous AM detector SD, an audio signal processing stage A and a loudspeaker device L. Signal processing in these circuits briefly is effected as follows. The long and medium-wave AM radio range from 150 kHz to 1.6 MHz is applied broad-banded through the RF-input stage RF to the mixer stage M and up converted in the mixer stage M to a high intermediate frequency of preferably at least three times the highest frequency of the received frequency band, for example, 8 MHz. The AM-IF signal at the output of the mixer stage M is selected in the IF-stage IF and synchronously detected with the aid of the synchronous AM detector SD. The base-band modulation signal thus obtained is processed in the audio signal processing part A and reproduced by the loudspeaker device L.

The AM receiver also includes a first phase control loop PLL1 functioning as a frequency synthesizer circuit and a second phase control loop PLL2 functioning as an IF carrier generator circuit. The first phase control loop PLL1 is provided with a tuning oscillator TO which has one end coupled to the mixer stage M and applies a mixing frequency to it for the aforementioned frequency conversion, and has the other end coupled through a frequency divider FDN to a first phase detector PD1. In this first phase detector PD1 the mixing frequency divided in the frequency divider FDN by a dividing factor N is compared with a reference frequency to be described hereinafter. The result of the comparison is applied through a first loop filter LP1 as a first control signal to a control input of the tuning oscillator TO so that the mixing frequency is in phase-synchronism with the reference frequency.

The second phase control loop PLL2 is provided with a voltage-controlled crystal oscillator VCXO functioning as a reference oscillator whose frequency is coupled in phase through a second phase detector PD2 with the carrier of the IF-AM signal. To this end a first input of the second phase detector PD2 is coupled to the IF-stage IF, a second input is coupled to a quadrature output (90°/270°) of the crystal oscillator VCXO and an output is coupled through a second loop filter LP2 to a control input of the crystal oscillator VCXO. An in-phase output (0°/180°) of the crystal oscillator VCXO is coupled to a carrier input of the synchronous AM detector SD and applies the local IF detection carrier thereto which is in phase with the carrier of the IF-AM signal for said detection of the modulation signal.

According to the invention the first and second phase control loops PLL1 and PLL2 are mutually coupled both for frequency and control current. The coupling for frequency is brought about because the crystal oscillator VCXO is connected through a frequency divider FDM—in which the reference frequency is divided by a dividing factor M—to the first phase detector PD1. The coupling for control current is brought about because the second loop filter LP2 is connected through a coupling circuit C to the control input of the tuning oscillator TO. In the embodiment shown the coupling circuit C includes a cascade arrangement of an inverting amplifier circuit AI and a frequency-dependent compensation circuit CC. The output signal from the coupling circuit C at the control input of the tuning oscillator TO is added to that of the first loop filter LP1, whilst the sign of the tuning slope of the reference and tuning oscillators—that is to say, the direction in which the oscillator frequency varies with a variation of the control voltage—is mutually equal. It stands to reason that such a negative feedback of the control signal from the reference oscillator to the tuning oscillator is also possible without signal inversion, that is to say, with a non-inverting amplifier, for example, by subtracting the output signal of the coupling circuit C at the control input of the tuning oscillator TO from that of the first loop filter LP1 or by using a reference oscillator and a tuning oscillator whose tuning slopes have opposite signs. Furthermore it is to be noted that the inventive idea can also be used when the frequency-dependent compensation circuit CC is omitted, as will be described hereinafter.

On the one hand the coupling for frequency prevents an unwanted variation of the mixing frequency being introduced through the coupling for control current, so that an extra phase correction in tuning is realized through the coupling for control current. On the other hand the coupling for frequency leads to a saving in the number of voltage-controlled oscillators normally required in conventional AM receivers, because the voltage-controlled oscillator VCXO supplies both the local inphase IF detection carrier for the synchronous AM detector SD and the reference frequency for the first phase control loop PLL1. It stands to reason that the intermediate frequency consequently corresponds to a number of times the reference frequency determined by the dividing factors M and N.

Besides, the use of a crystal oscillator as a voltage-controlled oscillator VCXO in the second phase control loop PLL2 reduces the requirements relative to the IF selectivity, thus leading to a further reduction in costs. Particularly when weak signals are received, a low-cost, comparatively weakly selective IF filter in the IF stage IF results in a strong influence of neighbouring transmitter signals on the input level of the second phase control loop PLL2. Neighbouring signals levels, which are 50 dB higher than the desired signal level, are no exception. Due to the comparatively large stability of the voltage-controlled crystal oscillator VCXO, a phase synchronization on the comparatively small carrier of the desired IF signal is still possible under such circumstances.

The negative feedback of the control signal of the reference oscillator VCXO to the tuning oscillator TO through the coupling circuit C for control current provides an improvement in stability, because positive interference feedback through the frequency coupling—which may arise as a result of unwanted phase shifts in the loop circuits—are compensated to a certain extent. However, the frequency-dependent compensation circuit CC of the coupling circuit C in the coupling for control current realizes a further optimisation of the stability, which will be described with reference to FIGS. 2, 3A and 3B.

Figure 2:
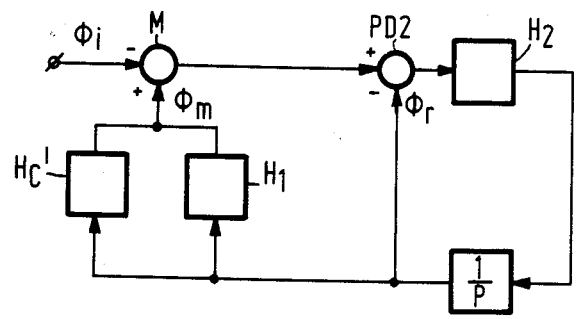
FIG. 2 shows the phase transfer diagram of the first and second phase control loop of the AM receiver of FIG. 1.

FIG. 2 shows for small phase variations the theoretical phase transfer diagram of the interconnected first and second phase control loops PLL1 and PLL2 of the AM receiver of FIG. 1. The mixer stage M and the second phase detector PD2 are shown in this Figure in their function of difference producers for the phase variations occurring at their inputs, the phase transfer function of the second loop filter LP2 is denoted by H2, the voltage phase transfer function of the voltage-controlled oscillator VCXO with one pole in its origin is denoted by 1/p and the phase transfer function of the first phase control loop PLL1 from the input of the frequency divider circuit FDM to the output of the tuning oscillator TO is denoted by H1. The transformed phase transfer function of the coupling circuit C from the output of the second loop filter LP2 to the output of the tuning oscillator TO is denoted by $H_c$, which is in parallel with $H_1$. It is to be noted that these transfer functions also include the DC gain or sensitivity of the relevant circuits and of the preceding and succeeding circuits. The transfer function $H_2$ thus also comprises the conversion gain of the mixer stage M, the amplitude of the IF signal, the amplification of the second phase detector PD2 as well as the sensitivity or frequency control slope of the voltage-controlled oscillator VCXO.

If the phase of the carrier of the AM reception signal is denoted $\phi_i$ and that of the reference frequency is denoted $\phi_r$, it can be derived from the diagram that in the open loop condition and in the absence of $H_c$, there applies that:

$$\frac{\phi_r}{\phi_i}(p) = \frac{H_2}{H_1 H_2 - H_2 - p} \qquad (1)$$

An optimum realisation of the first phase control loop PLL1 with respect to the spectral purity of the mixing signal is possible when its phase transfer function $H_1$ has one zero and three coincident poles on the negative real axis of the complex p-plane. The phase transfer function $H_1$ is then defined by the following equation:

$$H_1 = \frac{N}{M} \left( \frac{1 + p \cdot \tau_{11}}{(1 + p \cdot \tau_{12})^3} \right) \qquad (2)$$

in which N and M are the dividing factors of the respective frequency dividers FDN and FDM. In a practical embodiment of the first phase control loop PLL1 the zero was found to occur at $-55$ Hz and the three poles at $-166$ Hz on the said axis.

When using a conventional filter as a second loop filter LP2 with two poles at $-517$ Hz and 0 Hz, respectively, and one zero at $-50$ Hz, the transfer function $H_2$ may be written as:

$$H_2 = K_2 \frac{1 + p \cdot \tau_{21}}{(1 + p \cdot \tau_{22})(1 + p \cdot \tau_{23})} \qquad (3)$$

Figure 3A:
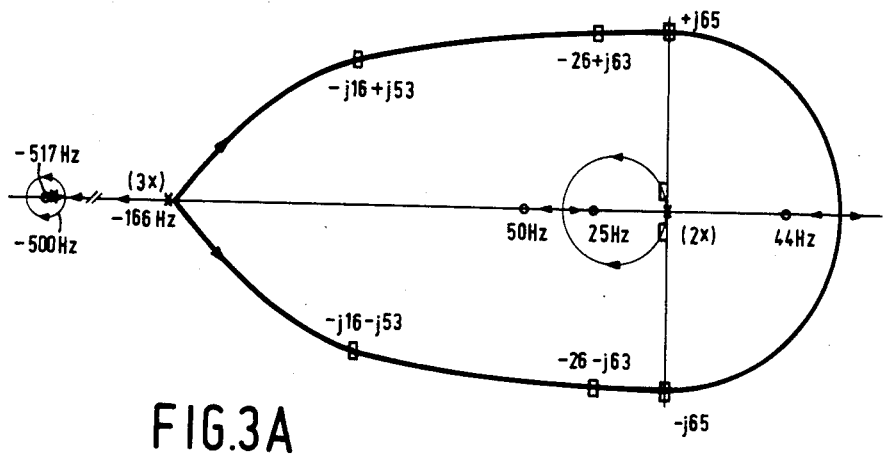
FIGS. 3A and B show the root locus diagram of the transfer function of the phase transfer diagram of FIG. 2 without and with the use of a coupling circuit.

When substituting (2) and (3) in (1) and starting from a given tuning frequency (1 MHz), an intermediate frequency of 8 MHz and with N/M=(9/16), the open loop transfer function (1) in the complex p-plane may be illustrated as is shown in FIG. 3A. The locations of the poles of the transfer function (1) vary in the direction of the arrow with an increasing d.c. gain factor $K_2$ of the transfer function $H_2$ and consequently also with the amplitude of the AM reception signal. When $K_2$ varies, these poles describe polar paths from zero to infinity, terminating at the zeros. It is then inevitable for some polar paths to pass or undesirably approach the right half-plane of the complex p-plane. In accordance with the theory of feed back systems as described, for example, in "Synthesis of feedback systems" by Isaac M. Horowitz, Academic Press, New York and London 1963, all poles should be located in the left half-plane for a stable transfer, which occurs for a very limited variation range of $K_2$, i.e. in a very limited input dynamic range of the AM receiver.

To obtain a stable transfer, at least for a dynamic range of 50 dB, a current control coupling is provided according to the invention whose transformed phase-transfer function already referred to hereinbefore is denoted by $H_{c'}$ in FIG. 2. The transfer function (1) than changes under the influence of $H_{c'}$ into:

$$\frac{\phi_r}{\phi_i}(p) = \frac{H_2}{H_2(H_1 + H_{c'}) - H_2 - p} \quad (4)$$

When appropriately choosing the transformed transfer function $H_{c'}$, it is possible according to a feature of the invention to locate all poles and zeros of the transfer function (4) on positions in complex p-plane, which are favourable for stabilisation. Practice has proved that this is already achieved substantially for the most relevant poles and zeros by a broadband negative feedback of the control signal from the reference oscillator VCXO to the tuning oscillator TO.

Figure 3B:
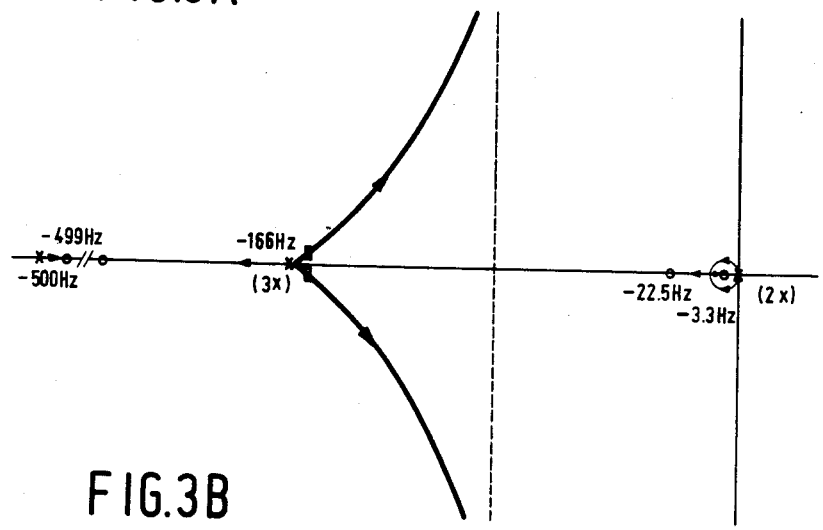

The stabilisation is optimized when all zeros of the transfer function (4) are located in the left half-plane of the complex p-plane, which is generally achieved when the transfer function of the coupling circuit C, i.e. the frequency-dependent compensation circuit CC, has a pole at or near the lowest frequency at which a pole also occurs in the first loop filter LP1. Starting from the aforementioned choice of transfer functions this can be realized in a simple manner by using an inverting proportionally integrating and differentiating network as a compensation circuit having a transfer function $H_c$ of the form:

$$H_c = K_c \frac{1 + p\tau_{C1}}{1 + p\tau_{C2}} \quad (5)$$

wherein $K_C < 0$ and wherein the pole at $-1/\tau_{C2}$ coincides with the pole of the first loop filter LP1 located nearest to the origin. A root locus diagram of the transfer function (4) having substituted therein the transformed transfer function $H_{c'}$ of $H_c$ in accordance with (5) and with the loop gain $K_2$ as a parameter is shown in FIG. 3B. The poles near the origin hardly change their location when the amplitude of the AM reception signal is varied and, likewise as the other poles, they remain in the left half-plane of the complex p-plane. The zero at 44 Hz in FIG. 3A is now shifted to $-3.3$ Hz in FIG. 3B so that all zeros are located in the left half-plane of the complex p-plane, thus guaranteeing the stability in a very large loop gain variation range.

In a practical embodiment of an AM receiver according to the invention double balanced ring mixers (Mini Circuits ZAD) were used for the mixer stage M and the second phase detector PD2, and an integrated frequency synthesiser circuit of the type Philips SAA 1057 was used for the first phase control loop PLL1. The bandwidth of the second phase control loop was 3.5 Hz, which is sufficiently narrow to adequately suppress neighbouring signals at a distance of 9 KHz from, and at an amplitude which is 50 dB larger than the desired AM reception signal.

Figure 4A:
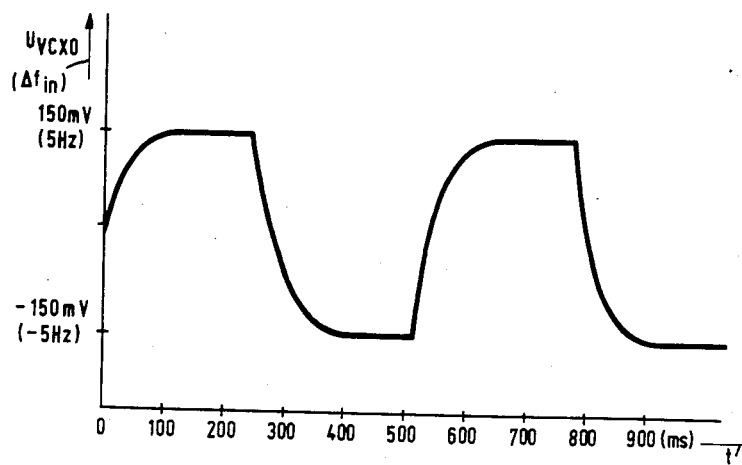
FIGS. 4A–D show graphs indicating the effect of the invention on the stability.

FIG. 4A shows the response at the input of the voltage-controlled oscillator VCXO in the case of a frequency variation in steps of 10 Hz at the input of the mixer stage M at a mixing or tuning frequency of 1.6 MHz and a maximum input signal level.

Figure 4B:
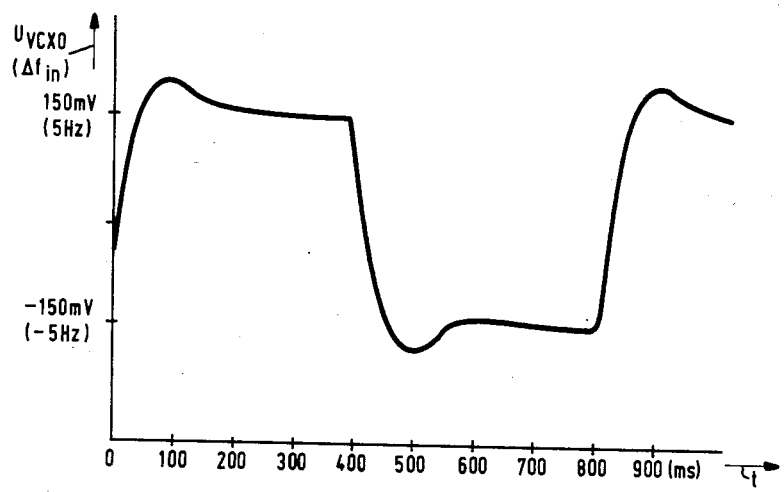

FIG. 4B shows a similar response at an input signal level which is 50 dB lower. In that case only slight and acceptable overshoot occurs. Comparable phenomena occur at different tuning frequencies within the aforementioned tuning range of the AM receiver.

Figure 4C:
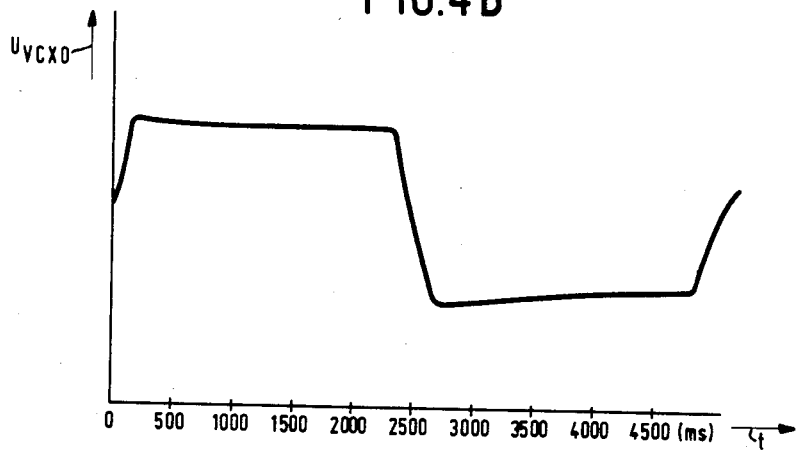
Figure 4D:
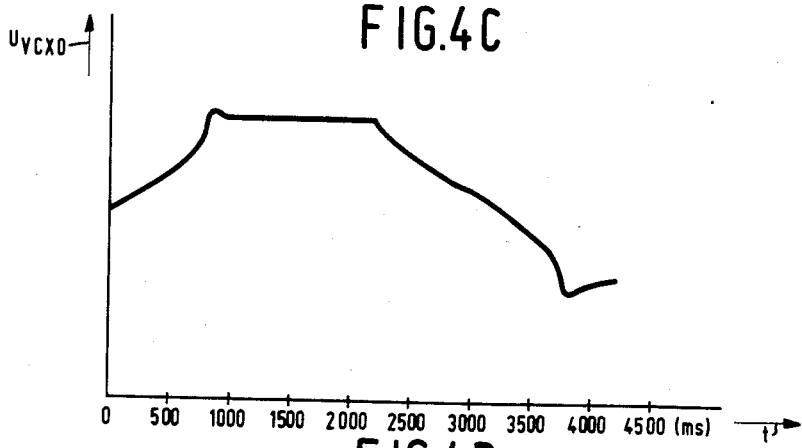

FIG. 4C shows the response at the input of the voltage-controlled oscillator VCXO for a frequency variation in steps of 63 Hz at the input of the mixer stage M at a maximum input signal level and FIG. 4D shows the response for an input signal level, which is 60 dB lower. It is obvious that in the latter case, thus at lower input signal levels and comparatively large frequency variations, the acquisition period of the coupled loops may last some periods of the AM carrier frequency longer than in the preceding cases. In practice, however, this is hardly noticeable.

Figure 5:
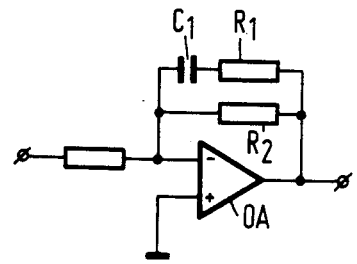
FIG. 5 shows a practical embodiment of a coupling circuit for use in the AM receiver of FIG. 1.

FIG. 5 shows a practical embodiment of a coupling circuit satisfying the aforementioned transfer function $H_c$ and being suitable for use in combination with a first loop filter LP1 with a pole at $-1/\tau_{C2}$ and a zero at $-55$ Hz.

The coupling circuit C includes an operational amplifier OA whose inverting input $(-)$ is connected through an input resistor to the output of the second loop filter LP2 (not shown), a non-inverting input $(+)$ being connected to ground and an output having one end fed back via an RC network $R_1$, $R_2$, $C_1$ to the inverting input and the other end being connected to the control input of the tuning oscillator TO (not shown). The RC network $R_1$, $R_2$, $C_1$ is constituted by a series RC member $R_1 C_1$ bridged by a resistor $R_2$. In this circuit the functions of the aforementioned inverter circuit or inverting amplifier AI and the frequency-dependent compensation circuit are combined. If signal inversion is not necessary, the inverting input of the operational amplifier OA is to be connected to ground through the input resistor, and the non-inverting input is to be connected to the output of the second loop filter LP2 (not shown).

The pole of the transfer function $H_C$ of the circuit shown occurs at $-1/\tau_{C2}$ and its location corresponds to that of the first loop filter LP1. This is determined by $\tau_{C2} = (R_1 + R_2)C_1$. The zero of $H_C$ occurs at $-1/\tau_{C1}$ and is determined by $\tau_{C1} = C_1 R_1$. In a practical embodiment $R_1$ and $R_2$ were 10 k$\Omega$ and 1 M$\Omega$, respectively, and $C_1$ was 0.68 $\mu$F.

It stands to reason that the invention is not limited to the embodiment shown for the transfer function $H_C$, but also alternative embodiments thereof are applicable, and that an improvement of the stability can already be obtained in principle with a simple frequency-independent amplifier as a coupling circuit. Due to the frequency-dependent variation $H_C$ of the coupling circuit C, i.e. the compensation circuit CC, the stability is further improved. It will be evident that for optimization of the stability in the case of dimensioning the loop circuits differently to that mentioned hereinbefore the transfer function $H_C$ should be adapted thereto in such a manner that no zeros occur in the right half-plane of the complex p-plane in the root locus diagram of the total loop transfer function.

What is claimed is:
1. An AM receiver comprising:
   a first phase control loop for establishing a tuning frequency including:
   (a) a mixer stage for receiving a radio frequency signal and a tuning frequency signal, and producing an IF signal;
   (b) a tuning frequency voltage controlled oscillator for providing said tuning frequency signal;

(c) a stable reference signal generator; and (d) a frequency control means for locking said tuning frequency signal in phase synchronism with said stable reference signal generator including a first loop filter for coupling a control voltage signal to a frequency control input of said voltage controlled tuning oscillator, and means for generating said control voltage as a function of the difference in phase between said stable reference frequency oscillator and said tuning frequency voltage controlled oscillator;

an AM baseband demodulator comprising a second phase control loop having a phase detector for receiving said mixer stage IF signal, and a signal from said reference signal generator, and a second loop filter for coupling an error signal from said phase detector to said reference signal generator, whereby said reference signal generator is phase locked with said IF signal; and, a coupling circuit for coupling said phase detector error signal to a frequency control input of said tuning frequency voltage controlled oscillator, whereby negative feedback from said reference signal generator to said voltage controlled oscillator results.

2. An AM receiver as claimed in claim 1, wherein the coupling circuit includes a frequency-dependent compensation circuit whose transfer function has a pole at the lowest frequency, while a pole also occurs in the transfer function of the first loop filter.

3. An AM receiver as claimed in claim 2, wherein the frequency-dependent compensation circuit includes a differentiating integrating network.

4. An AM receiver as claimed in claim 1, wherein the coupling circuit also includes an amplifier circuit.

5. An AM receiver as claimed in claim 4 wherein the amplifier circuit also inverts a signal from said second loop filter.

6. An AM receiver as claimed in claim 3, wherein the inverting compensation circuits have an operational amplifier in common which has an inverting input coupled to the second loop filter, a non-inverting input to ground and an output coupled at one end to the inverting input through a resistor-bridged series RC member, and coupled at the other end to the control input of the tuning oscillator.

* * * * *